United States Patent [19]
Oshima et al.

[11] Patent Number: 5,618,580
[45] Date of Patent: Apr. 8, 1997

[54] METHOD FOR PRODUCING CERAMIC FINE PARTICLES AND APPARATUS USED THEREFOR

[75] Inventors: Kentaro Oshima, Wakayama; Toshiharu Numata, Tokyo; Toru Nishimura, Wakayama; Sachiko Kokubo, Saitama; Keiichi Tsuto, Wakayama, all of Japan

[73] Assignee: Kao Corporation, Tokyo, Japan

[21] Appl. No.: 454,292

[22] PCT Filed: Dec. 24, 1993

[86] PCT No.: PCT/JP93/01889

§ 371 Date: Jun. 15, 1995

§ 102(e) Date: Jun. 15, 1995

[87] PCT Pub. No.: WO94/14530

PCT Pub. Date: Jul. 7, 1994

[30] Foreign Application Priority Data

Dec. 28, 1992 [JP] Japan .................................. 4-360755
Feb. 27, 1993 [JP] Japan .................................. 5-063280

[51] Int. Cl.$^6$ .................... B05D 7/00; C01G 23/047
[52] U.S. Cl. ............ 427/212; 427/215; 427/255.1; 427/255.2; 427/255.3; 427/255.7; 427/419.1; 427/419.2; 427/419.3; 423/610; 423/611; 423/612; 423/613; 423/622; 423/625; 118/715; 118/716
[58] Field of Search ................... 427/212, 215, 427/255.1, 255.2, 255.3, 255.7, 419.1, 419.2, 419.3; 118/715, 716; 423/610, 611, 612, 613, 622, 625

[56] References Cited

U.S. PATENT DOCUMENTS

| | | | |
|---|---|---|---|
| 4,615,294 | 10/1986 | Scapple et al. | 118/725 |
| 4,937,095 | 6/1990 | Fukatsu et al. | 427/294 |
| 5,125,359 | 6/1992 | Barale et al. | 118/725 |
| 5,370,737 | 12/1994 | Mathis | 118/730 |

FOREIGN PATENT DOCUMENTS

| | | |
|---|---|---|
| 56-139122 | 10/1981 | Japan . |
| 63-29582 | 6/1988 | Japan . |
| 63-46002 | 9/1988 | Japan . |
| 63-319045 | 12/1988 | Japan . |
| 64-80437 | 3/1989 | Japan . |
| 1-286919 | 11/1989 | Japan . |

(List continued on next page.)

OTHER PUBLICATIONS

English language abstract of Japanese reference 56–139122.
English language abstract of Japanese reference 4–10376.
English language abstract of Japanese reference 4–35215.
English language abstract of Janpanese reference 63–29582.
English language abstract of Japanese reference 63–46002.
English language abstract of Japanese reference 63–319045.

(List continued on next page.)

*Primary Examiner*—Shrive Beck
*Assistant Examiner*—David M. Maiorana
*Attorney, Agent, or Firm*—Birch Stewart, Kolasch & Birch, LLP

[57] ABSTRACT

The present invention provides a method for producing ceramic fine particles comprising the steps of supplying gaseous starting materials or starting material droplets to a reaction space arranged in an annular portion between inner and outer cylinders of a coaxial, double-cylinder reaction apparatus, the reaction apparatus having a stationary outer cylinder and a rotatable inner cylinder; and subjecting the gaseous starting materials or the starting material droplets to reaction in the reaction space while rotating the inner cylinder. Also, the present invention provides a production apparatus used therefor. In the present invention, by utilizing the Taylor vortex flow as the flow for a CVD reaction field or a pyrolytic reaction field, uniform ceramic fine particles can be produced at a high yield because of an even temperature distribution, and an even concentration distribution of the reaction gases or an even concentration distribution of the droplet number in the vortex flow, and residence time of the resulting fine particles locked in the vortex flow.

18 Claims, 5 Drawing Sheets

FOREIGN PATENT DOCUMENTS

| | | |
|---|---|---|
| 2-59425 | 2/1990 | Japan . |
| 2-208369 | 8/1990 | Japan . |
| 2-196023 | 8/1990 | Japan . |
| 3-88877 | 4/1991 | Japan . |
| 4-10376 | 2/1992 | Japan . |
| 4-97907 | 3/1992 | Japan . |
| 4-35215 | 6/1992 | Japan . |

OTHER PUBLICATIONS

English language abstract of Japanese reference 1–286919.
English language abstract of Japanese reference 2–208369.
English language abstract of Japanese reference 4–97907.
English language abstract of Japanese reference 64–80437.
English language abstract of Japanese reference 2–196023.
English language abstract of Japanese reference 3–88877.
English language abstract of Japanese reference 2–59425.

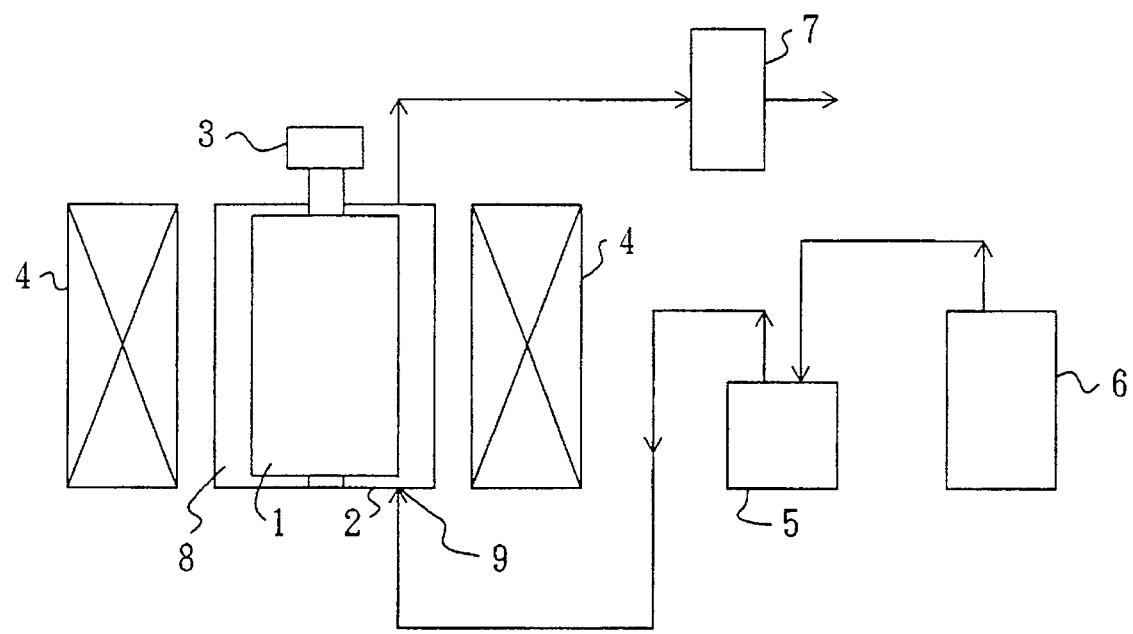
F I G. 1

F I G. 2
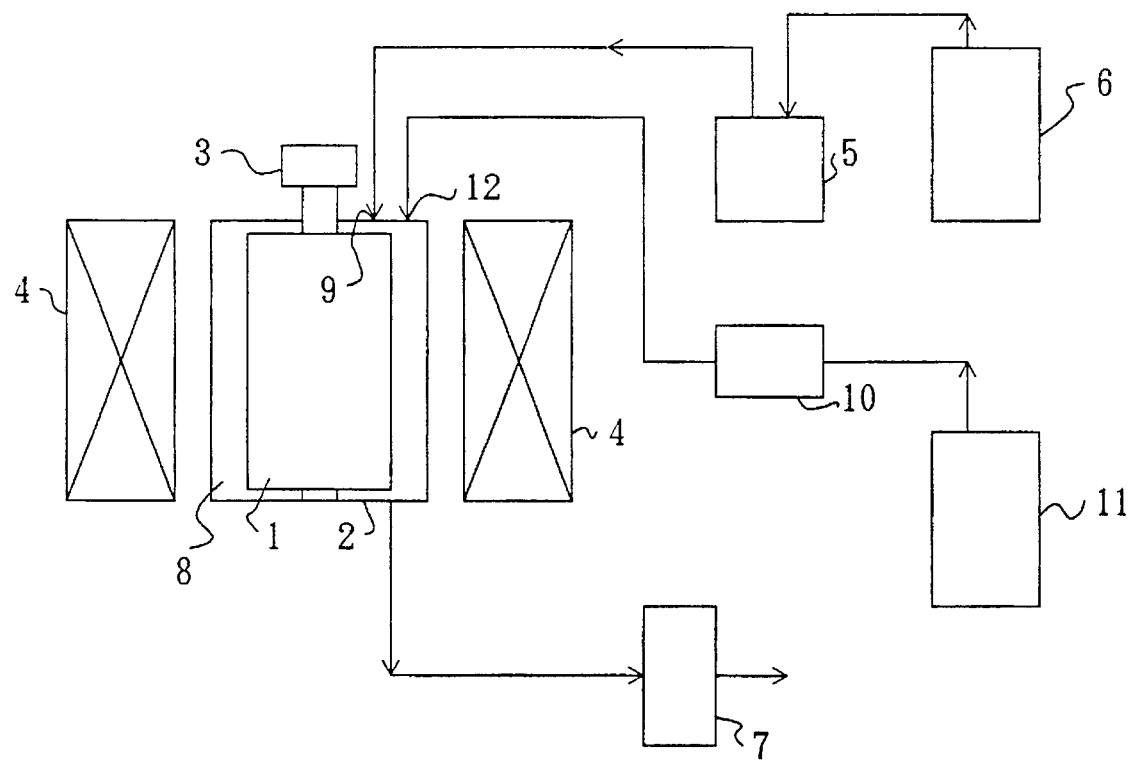

METHOD FOR PRODUCING CERAMIC FINE PARTICLES AND APPARATUS USED THEREFOR

TECHNICAL FIELD

The present invention relates to a method for producing ceramic fine particles and an apparatus used therefor. More specifically, it relates to a method for continuously producing ceramic fine particles comprising vaporizing one or more kinds of metal compounds to give gaseous starting materials, and then subjecting the gaseous starting materials to chemical reaction, namely by the CVD method (Chemical Vapor Deposition method), or a method for continuously producing ceramic fine particles comprising treating a solution containing one or more kinds of metal salts to form fine starting material droplets, and then subjecting the starting material droplets to pyrolyric reaction, namely a spray pyrolysis method, and it also relates to a production apparatus used for these production methods.

BACKGROUND ART

In general, ceramic fine particles include fine particles of oxides, such as $TiO_2$, $ZnO$, $Al_2O_3$, and $SiO_2$, those of carbides, such as-SiC and TiC, and those of nitrides, such as $Si_3N_4$, TiN, and AlN. Having various properties, such as photoconductivity, piezoelectricity, fluorescence, and catalytic effects, the fine particles are frequently used in various industrial fields.

Among the ceramic fine particles, titanium oxide fine particles, for instance, have diversified industrial applications, and they are used as white pigments, magnetic starting materials, abrasives, pharmaceuticals, and ultraviolet shielding materials.

Also, SiC fine particles, for instance, have diversified industrial applications, and they are used, for instance, for thermistors utilizing their resistivity stability and for varistors utilizing their non-linearity of voltage-current relationship. Other ceramic fine particles also have various industrial applications.

As mentioned above, although ceramic fine particles have very great industrial applications, it is important to produce uniform fine particles with a narrow particle diameter distribution in order to optimize their performance. In other words, by producing fine particles, specific surface areas thereof are increased, and the proportion of number of molecules located on the surface of the fine particles based on the entire number of molecules constituting the fine particles increases. Therefore, the surface energy of the fine particles is increased, and the performance of the fine particles per unit weight is markedly enhanced. In addition, no variation in the performance of the fine particles is found, because the particle diameter distribution is narrow.

Also, by forming a concentric, multi-layered structure, the ceramic fine particles can enjoy the combined functions of the ceramic constituting the respective layers, and the improved properties for the surface of the substances forming the core. In order to exhibit an optimum performance of the fine particles having a multi-layered structure mentioned above, each of the layers constituting the ceramic fine particles has to be uniformly coated. By uniformly and evenly coating the outermost layer, in particular, it is possible to inhibit the properties of the surface of the inner layer from directly affecting the outer portion, and to uniformly exhibit the properties of the outermost layer.

The methods for producing ceramic fine particles of having extremely important industrial applications as mentioned above can be roughly divided into a liquid-phase method and a vapor phase method.

Examples of the liquid-phase methods include a method for producing zinc oxide fine particles comprising hydrolyzing a metal alkoxide thereof, to give zinc oxide fine particles (Japanese Patent Laid-Open No. 2-59425). Also, in general, a long-time method used comprises adding an acid or alkali solution to a metal salt to cause a reaction in the liquid-phase, to give desired ceramic fine particles.

As for fine particles having a multi-layered structure, for example, a method comprising the steps of adding a metal salt to an aqueous suspension of, for instance, $TiO_2$ fine particles, and coating the surface of the fine particles with a metal oxide by a neutralization reaction is known (Japanese Patent Laid-Open No. 3-88877).

The production processes based on the liquid-phase method are difficult to automate, because they are basically subject to a batch process. In addition, because the formed fine particles are obtained in a solid-liquid mixed phase, filtration and drying steps have to be added to give a finished product. Therefore, the entire production process becomes more complicated, and maintenance of the entire process becomes difficult, which in turn makes it difficult to lower product cost.

The vapor-phase methods include a method for producing ceramic fine particles generally comprising the steps of vaporizing a metal, and mixing the formed vapor and an oxygen-containing gas to carry out a catalytic oxidation reaction (For instance, methods for producing zinc oxide fine particles are disclosed in Japanese Patent Laid-Open Nos. 1-286919 and 2-208369). Also, there is a method for producing fine particles known as CVD method (chemical vapor deposition method), as one means for the vapor-phase method, the method comprising the steps of introducing gaseous starting materials together with a carrier gas into a reaction tube, and supplying energy by heating or other means to the gaseous starting materials in the reaction tube to cause a chemical reaction, to give fine particles. The fine particles obtained by this method have a high product purity and a relatively even particle diameter. Examples of this kind of methods include a method for producing an amorphous, spherical silica powder according to the CVD method using an organic silicon compound as a starting material (Japanese Patent Laid-Open No. 4-97907), and a method for producing coated fine particles comprising forming a fluidized bed comprising fine particles using a low-high frequency synthetic sound wave and coating the fluidized bed by the CVD method (Japanese Patent Laid-Open No. 64-80437).

As for a method having the properties of both the liquid-phase method and vapor-phase method mentioned above, there is a spray pyrolysis method, comprising the steps of atomizing an aqueous solution or organic solvent solution, each solution containing a metal salt of an inorganic acid or organic acid, conveying the atomized liquid particles to a heating furnace, and carrying out a pyrolytic reaction with the liquid particles, to give oxide fine particles (For instance, a method for producing an oxide superconductor is disclosed in Japanese Patent Laid-Open No. 2-196023).

In the above-mentioned vapor-phase method, or the CVD method, which is one means thereof, and the spray a pyrolysis method, which is a modified method thereof, in general, for the purposes of controlling the particle diameter and crystallinity of the produced fine particles in a reactor for producing fine particles, the fine particles are produced by supplying gaseous starting materials in a laminar flow into a tube type reactor to achieve an even temperature distribution and an even concentration distribution of the gaseous starting materials, or an even density distribution of the starting material droplets in the reactor. Therefore, it is difficult to obtain an even temperature distribution, concentration distribution of gaseous starting materials or density distribution of starting material droplets in the reactor when "scale-up" of the reactor takes place, so that scale-up of the reactor is made difficult. In addition, the yield is low because large amounts of fine particles are adhered to the inner wall of the reactor.

On the other hand, in the case of employing liquid-liquid reaction, a method for producing uniform droplets using Taylor vortex flow is disclosed in Japanese Patent Laid-Open No. 56-139122. Here, the Taylor vortex flow is a donut-shaped vortex flow exhibited in a fluid when the gap between double cylinders sharing the same center of axis is filled with the fluid and the inner cylinder is rotated at a given rotational speed or higher, while keeping the outer cylinder stationary. The Taylor vortex flow is regularly stacked in the axial direction of the cylinder, and it can be parallel-shifted in stacks without extinction by setting an appropriate axial flow velocity in the liquid phase. By utilizing the above-mentioned Taylor vortex flow, the scale-up of the reactor becomes easy, so that continuous reaction can be carried out. However, examples applying to either of the vapor-phase method or the spray pyrolysis method have not so far been known.

Although applications of the Taylor vortex flow to production of uniform droplets in a liquid-liquid system and to liquid-liquid reactions is disclosed in Japanese Patent Laid-Open No. 56-139122 mentioned above, a method for producing ceramic fine particles utilizing the Taylor vortex flow has not yet been known.

DISCLOSURE OF THE INVENTION

The present invention has been developed to solve the above-mentioned issues, including difficulty in the scale-up of the reactor and a low yield in the vapor-phase method and the spray pyrolysis method. The present inventors have found that ceramic fine particles can be mass-produced in a high yield by using the Taylor vortex flow mentioned above, because scale-up of the reactor can be easily carried out with a simple process, so that continuous operation is made possible, and that small amounts of the fine particles are adhered to the wall surfaces of the inner cylinder and the outer cylinder. The present inventors have made further investigations based on this finding, and developed the present invention.

Specifically, the gist of the present invention is the following:

(1) A method for producing ceramic fine particles comprising the steps of vaporizing one or more kinds of metal compounds to give gaseous starting materials; supplying the gaseous starting materials with a carrier gas into a reaction space arranged in an annular portion between inner and outer cylinders of a coaxial, double-cylinder reaction apparatus, the reaction apparatus having a stationary outer cylinder and a rotatable inner cylinder; and subjecting the gaseous starting materials to reaction in the reaction space while rotating the inner cylinder;

(2) An apparatus for producing ceramic fine particles comprising a starting material vaporizer for vaporizing one or more kinds of metal compounds to give gaseous starting materials; a device for supplying a carrier gas for conveying the gaseous starting materials; a coaxial, double-cylinder reaction apparatus for forming Taylor vortex flow, the reaction apparatus having a stationary outer cylinder and a rotatable inner cylinder, and further comprising a feed opening for supplying the gaseous starting materials; an inner cylinder rotating motor device for rotating the inner cylinder; an energy supplying device for supplying energy required for chemical reaction to the reaction space, the reaction space being arranged in an annular portion between the inner and outer cylinders of the reaction apparatus; and a device for collecting fine particles, the fine particles to be collected being in a vapor phase coming out from the reaction space;

(3) A method for producing ceramic fine particles comprising the steps of forming fine starting material droplets having an average droplet diameter of 0.1 µm to 100 µm using a solution containing one or more kinds of metal salts; supplying the starting material droplets with a carrier gas to the reaction space arranged in an annular portion between inner and outer cylinders of a coaxial, double-cylinder reaction apparatus, the reaction apparatus comprising a stationary outer cylinder and a rotatable inner cylinder; and subjecting the starting material droplets to a pyrolytic reaction in the reaction space while rotating the inner cylinder; and (4) An apparatus for producing ceramic fine particles comprising a device for supplying a solution containing one or more kinds of metal salts; a device for atomizing starting materials for forming fine droplets from the solution to give starting material droplets; a device for supplying a carrier gas for conveying said starting material droplets; a coaxial, double-cylinder reaction apparatus for forming Taylor vortex flow, the reaction apparatus comprising a stationary outer cylinder and a rotatable inner cylinder; an inner cylinder rotating motor device for rotating the inner cylinder; a thermal energy supplying device for supplying thermal energy required for pyrolyric reaction to the reaction space, the reaction space being arranged in an annular portion between the inner and outer cylinders of the reaction apparatus; and a device for collecting fine particles, the fine particles to be collected being in a vapor phase coming out from the reaction space.

In the present invention, with respect to the production method of (1) above, the following method is a preferred embodiment in order to produce ceramic fine particles having a multi-layered structure:

(i) A production method comprising the steps of further supplying core fine particles besides gaseous starting materials to a reaction space with a carrier gas to coat the surface of the core fine particles with a ceramic formed by the reaction of the gaseous starting materials.

(ii) A production method comprising the steps of supplying different kinds of gaseous starting materials to a reaction space with a carrier gas through two or more feed openings, the feed openings being arranged in a coaxial, double-cylinder reaction apparatus, to form ceramic fine particles having a multi-layered structure with a ceramic formed by the reactions of each of the gaseous starting materials.

(iii) A production method comprising the steps of supplying core fine particles to a reaction space with a carrier gas at the same time supplying different kinds of gaseous starting materials to a reaction space with a carrier gas through two or more feed openings, the feed openings being arranged in a coaxial, double-cylinder reaction apparatus, to form ceramic fine particles having a multi-layered structure comprising a ceramic formed by the reactions of each of the gaseous starting materials, and the core particles.

BRIEF DESCRIPTION OF THE DRAWINGS

FIG. 1 is a schematic view showing an example of an apparatus for producing fine particles in Embodiment A of the present invention.

FIG. 2 is a schematic view showing an example of an apparatus for producing fine particles having a multi-layered structure in Embodiment A of the present invention.

Figure 3:
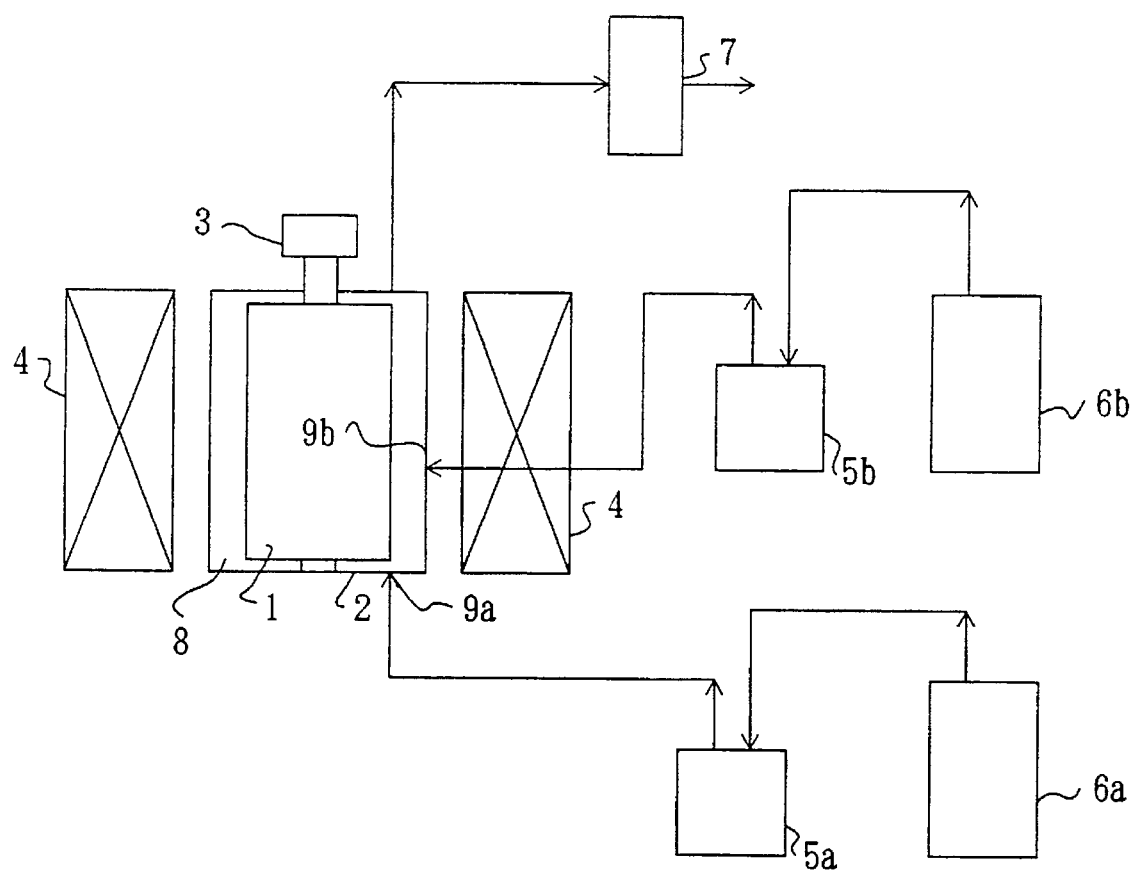
FIG. 3 is a schematic view showing an example of an apparatus for producing fine particles having a multi-layered structure in Embodiment A of the present invention.

The reference numerals used in FIG. 1 through FIG. 5 are as follows:

1 is an inner cylinder, 2 an outer cylinder, 3 a motor device for rotating an inner cylinder, 4 a device for supplying energy required for chemical reaction, 5 a starting material vaporizer, 5a a starting material vaporizer (evaporator), 5b a starting material vaporizer (evaporator), 6 a device for supplying a carrier gas, 6a a device for supplying a carrier gas, 6b a device for supplying a carrier gas, 7 a device for collecting fine particles, 8 a reaction space, 9 a feed opening for supplying gaseous starting materials, 9a a feed opening for supplying gaseous starting materials, 9b a feed opening for supplying gaseous starting materials, 10 a powder supply dispersion device, 11 a device for supplying a carrier gas used for conveying powder, 12 a feed opening for supplying core fine particles, 13 a vessel, 14 a circulation pump for conveying fluids, 15 a device for atomizing starting materials, and 16 a device for supplying thermal energy.

BEST MODE FOR CARRYING OUT THE INVENTION

The present invention is hereinafter explained in detail referring to the drawings.

The present invention is roughly divided into an embodiment comprising the steps of supplying gaseous starting materials to a reaction space arranged in an annular portion between the inner and outer cylinders of a coaxial, double-cylinder reaction apparatus, and subjecting the gaseous starting materials to reaction in the reaction space while rotating the inner cylinder; and an embodiment comprising the steps of supplying starting material droplets to a similar apparatus, and subjecting the starting material droplets to pyrolyric reaction in the reaction space. The production method of the present invention utilizing the vapor-phase reaction mentioned above is referred to as Embodiment A, and the production method of the present invention utilizing the liquid-phase reaction is referred to as Embodiment B, each of which is hereinafter explained separately.

Embodiment A

In the ceramic fine particles obtained by the method according to Embodiment A of the present invention, there are two kinds, namely, those comprising a single layer and those having a multi-layered structure. There are various embodiments for apparatuses for producing the ceramic fine particles.

FIG. 1 is a schematic view showing an example of an apparatus for producing ceramic fine particles comprising a single layer.

In FIG. 1, the gaseous starting materials comprising one or more kinds of metal compounds vaporized by a starting material vaporizer 5 are introduced into the coaxial, double-cylinder reaction apparatus through a feed opening 9 for supplying starting materials arranged at the bottom portion of the apparatus with a carrier gas supplied from a device 6 for supplying a carrier gas, the reaction apparatus having a stationary outer cylinder 2 and a rotatable inner cylinder 1. At this time, the inner cylinder is being rotated by a motor device 3 for rotating an inner cylinder. By setting the rotational angular velocity of the inner cylinder and the axial velocity of the vapor phase at suitable values in the gap (a reaction space 8) formed between the inner cylinder 1 and the outer cylinder 2, a Taylor vortex flow, which is an annular vapor-phase vortex flow, can be formed. The Taylor vortex flow is in a state of a vapor-vapor mixed phase at the inlet, and as the Taylor vortex flow shifts toward the outlet, the gaseous starting materials contained in the Taylor vortex flow are energized by an energy supplying device 4 for supplying energy required for chemical reaction, and chemical reaction takes place to form ceramic fine particles. The fine particles in the vapor phase coming out from the reaction space 8 are collected by a device 7 for collecting fine particles.

The starting material vaporizer is preferably an evaporator having a temperature-controllable heating member, with a particular preference to one in which the amount of the starting materials evaporated can be kept at a given level.

The device for supplying a carrier gas may be any ones which can supply a given amount of flow of the carrier gas for a long period of time. As for a device for controlling a flow of the carrier gas, for instance, a mass flow meter may be used.

The coaxial, double-cylinder reaction apparatus comprises a stationary outer cylinder and a rotatable inner cylinder, and an annular portion formed in a gap between the inner cylinder and the outer cylinder is used as a reaction space. As for materials for the apparatus, stainless steel, ceramics, silica glass, etc. can be used.

The motor device for rotating an inner cylinder is a device which can make the inner cylinder rotate at a given speed for a long period of time, and for instance, an inverter-type motor may be used.

As for devices for supplying energy required for chemical reaction, thermal, photo-induced, and plasma generators are respectively used for each of processes of thermal CVD, photo-induced CVD, and plasma CVD. More specifically, examples of generators include temperature-controllable high-temperature heating members (electric furnace, etc.), low-pressure mercury lamps, $CO_2$ lasers, ArF lasers, arc plasmas, and high-frequency induction thermal plasmas. The conditions of energy when using these energy supplying devices are not particularly limited, and the conditions can be suitably set depending upon the subject reaction. For instance, in the case of using a high-temperature heating members in thermal CVD, a suitable temperature may be set in the range of from normal temperature to 1500° C.

Examples of these reactions include the following:

$$Ti(OC_3H_7)_4 \longrightarrow TiO_2 + 4C_3H_6 + 2H_2O \quad \text{(Thermal CVD)}$$

$$(Si(CH_3)_3)_2NH \longrightarrow Si_2NC_6H_{19} \quad \text{(Photo-induced CVD)}$$

$$SiH_4 + N_2 \longrightarrow SiN_2H_4 \quad \text{(Plasma CVD)}$$

In addition, as for the energy distribution in this reaction space, in the case of the thermal CVD, those which can make the temperature distribution in the reaction space even are preferred, and in cases of the photo-induced CVD and the plasma CVD, those having uniform photo-induced field and uniform plasma field are preferred.

As for the device for collecting fine particles, a filter-type or electrostatic-type collector is effectively used, with a preference given to an electric dust collector or a diffusion charge-type electrostatic collector for a long-term operation.

Next, an apparatus for producing ceramic fine particles having a multi-layered structure will be explained. There are three embodiments for producing ceramic fine particles having a multi-layered structure given below.

First, FIG. 2 is a schematic view showing an example of an apparatus of the first embodiment for producing ceramic fine particles having a multi-layered structure according to Embodiment A of the present invention.

In FIG. 2, an inner cylinder 1, an outer cylinder 2, a motor device 3 for rotating an inner cylinder, an energy supplying device 4, a starting material vaporizer 5, a device 6 for supplying a carrier gas, and a reaction space 8 have similar functions to those of FIG. 1 explained above, and a mechanism of forming a Taylor vortex flow using the above members and subjecting gaseous starting materials to chemical reaction is similar to the case of FIG. 1 explained above. In this apparatus, a feed opening 12 for supplying core fine particles is further arranged in the coaxial, double-cylinder reaction apparatus, to which a means for supplying core fine particles is connected. Specifically, a means for supplying core fine particles used herein refers to a means for dispersing in a carrier gas fine particulate substances constituting the core of the ceramic fine particles (hereinafter simply referred to as "core fine particles") by using a powder supply dispersion device 10, the carrier gas being supplied from a device 11 for supplying a carrier gas used in conveying powder; and supplying the carrier gas containing the core fine particles into the reaction space 8 from a feed opening 12 for supplying core fine particles. In this embodiment, the ceramic fine particles having a multi-layered structure can be produced by the steps of supplying the gaseous starting materials from a feed opening 9 for supplying gaseous starting materials, the feed opening being arranged, for instance, at the top portion of the coaxial, double-cylinder reaction apparatus; subjecting the gaseous starting materials to chemical reaction to form ceramic; and coating the surface of the core fine particles supplied from the feed opening 12 with the ceramic. The fine particles contained in the vapor phase coming out from the reaction space 8 are collected by using a device 7 for collecting the fine particles in the same manner as in FIG. 1 explained above. The feed opening 12 for supplying core fine particles is normally arranged near the inlet of the reaction space. The devices for supplying a carrier gas used in conveying powder may be any ones as long as a given amount of flow of the carrier gas can be supplied for a long period of time as similarly as the device for supplying the carrier gas, the device for supplying a carrier gas used in conveying powder comprising a source for supplying a carrier gas and a device for controlling amount of flow. Of the above, the source for supplying a carrier gas may be shared with that in the device for supplying a carrier gas.

In addition, the powder supply dispersion device may be any one as long as the core fine particles can be uniformly dispersed in the carrier gas at a given concentration. Examples thereof include a device for dispersing the core fine particles in the carrier gas by having a powder storage vessel and passing the core fine particles supplied at a given speed from the storage vessel through a thin pipe at a high speed by using the carrier gas.

FIG. 3 is a schematic view showing an example of an apparatus of the second embodiment for producing ceramic fine particles having a multi-layered structure according to Embodiment A of the present invention.

In FIG. 3, an inner cylinder 1, an outer cylinder 2, a motor device 3 for rotating an inner cylinder, an energy supplying device 4, starting material vaporizers 5a, 5b, devices 6a, 6b for supplying a carrier gas, and a reaction space 8 have similar functions to those of FIG. 1 explained above, and a mechanism of forming a Taylor vortex flow using the above members and subjecting gaseous starting materials to chemical reaction is similar to the case of FIG. 1 explained above.

The apparatus of FIG. 3 differs from that of FIG. 1 in that it has two feed openings (9a, 9b) for supplying gaseous starting materials, whereas the apparatus of FIG. 1 has one feed opening for supplying gaseous starting materials. In this embodiment, for instance, the ceramic fine particles having a multi-layered structure can be produced by the steps of supplying the gaseous starting materials from a feed opening 9a for supplying gaseous starting materials, the feed opening 9a being arranged at the bottom portion of the apparatus; subjecting the gaseous starting materials to chemical reaction to form ceramic; and coating the surface of the ceramic obtained above with another ceramic, the other ceramic being produced by subjecting different gaseous starting materials supplied from a feed opening 9b to chemical reaction, the feed opening 9b being arranged at the wall portion of the outer cylinder of the apparatus. Since different kinds of gaseous starting materials are supplied at each of the feed openings, a multi-layered structure can be formed depending upon the kinds of the gaseous starting materials used. Although a case having two feed openings for supplying gaseous starting materials is exemplified in FIG. 3, the number of feed openings is not particularly limited thereto, and the number of the feed openings may be appropriately determined according to the number of desired layers.

Figure 4:
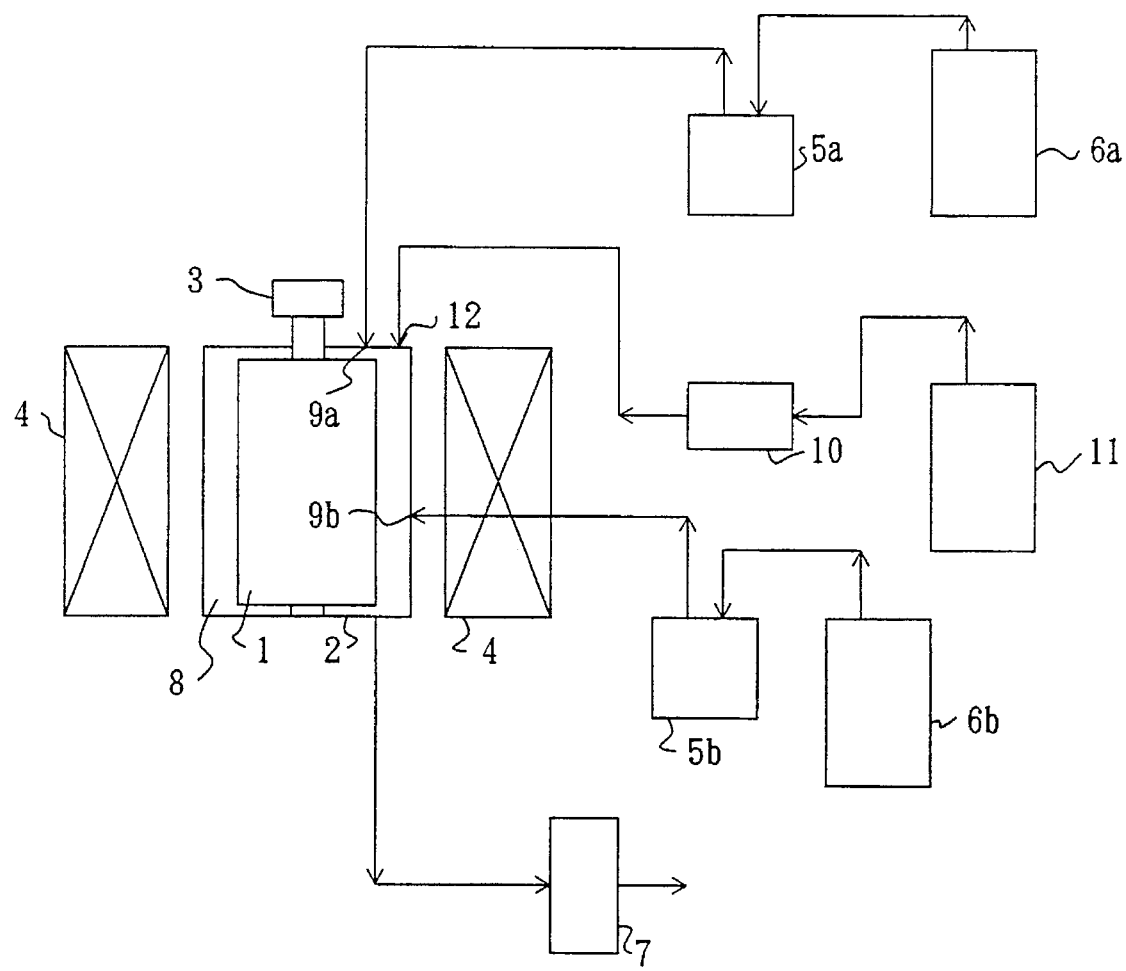
FIG. 4 is a schematic view showing an example of an apparatus for producing fine particles having a multi-layered structure in Embodiment A of the present invention.

The third embodiment for producing ceramic fine particles having a multi-layered structure according to Embodiment A of the present invention is a device in which the features of the first embodiment and the second embodiment mentioned above are combined. Specifically, the apparatus is a coaxial, double-cylinder reaction apparatus comprising a feed opening for supplying core fine particles and a means for supplying the core fine particles connected thereto, and further comprising two or more feed openings for supplying gaseous starting materials (FIG. 4). By using this apparatus, ceramic fine particles having a multi-layered structure comprising a plurality of ceramic coat layers formed on the surface of the core fine particles can be produced. As for each of the devices and members in this embodiment, the same ones as those in the first embodiment and the second embodiment can be used.

In the present invention, there are three embodiments for producing ceramic fine particles having a multi-layered structure according to Embodiment A as mentioned above, among which a preference is given to the first or third embodiment from the viewpoint of easy control in the particle diameter of the ceramic fine particles having a multi-layered structure.

Next, the method for producing the ceramic fine particles of the present invention using the apparatuses in Embodiment A of the present invention mentioned above will be explained.

The gaseous starting materials used in the present invention are one or more kinds of metal compounds in the vapor state. As shown in FIG. 3, in the case where two or more feed openings for supplying gaseous starting materials are provided, different kinds of gaseous starting materials are used.

The metal elements used in the metal compounds are specifically alkali metals, alkaline earth metals, transition metals, etc. Examples thereof include alkali metals, such as Li, Na, K, Rb, Cs, and Fr; alkaline earth metals, such as Be, Mg, Ca, Sr, Ba, and Ra; and transition metals including elements in the fourth series of the periodic table, such as Sc, Ti, V, Cr, Mn, Fe, Co, Ni, Cu, Zn, Ga, Ge, and As; elements in the fifth series, such as Y, Zr, Nb, Mo, Tc, Ru, Rh, Pd, Ag, Cd, In, Sn, and Sb; elements in the sixth series, such as La, Hf, Ta, W, Re, Os, Ir, Pt, Au, Hg, Tl, Pb, and Bi; and other elements, such as Al and Si.

Also, kinds of metal compounds are metal chlorides, hydrogenated metals, and organometallic compounds including metal alkoxides, alkylated metals, metal complexes with β-diketones. Specific examples of the metal compounds include $TiCl_4$, $SiCl_4$, $SiH_4$, $AsH_3$, $Ti(OC_3H_7)_4$, $Al(OC_3H_7)_3$, $Al(CH_3)_3$, $Zn(C_2H_5)_2$, $Zn(C_{11}H_{19}O_2)_2$, and $Zr(C_{11}H_{19}O_2)_4$.

These metal compounds may be used in a vapor phase singly or as a mixture. In the case where a mixture, for instance, a mixed gas of a $Ti(OC_3H_7)_4$ gas and a $Zn(C_2H_5)_2$ gas, is used, composite fine particles comprising $TiO_2$ fine particles and ZnO fine particles can be obtained by the CVD method.

The carrier gas refers to an inert gas, or any gases which do not inhibit the progress of the chemical reaction, and for instance, helium, air, nitrogen, etc. may be used. The amount of flow of the carrier gas is preferably adjusted so that the amount of flow of the carrier gas is an amount not more than that which may cause to break the Taylor vortex flow, which is an annular vortex in a vapor phase, and the residence time of the carrier gas containing the gaseous starting materials in the reaction space becomes not shorter than 1 second.

The concentration of the gaseous starting materials is preferably in the range of from 0.001 to 40% by weight, desirably in the range of from 0.01 to 20% by weight, based on the carrier gas. The reasons for limitations are as follows. When the concentration of the gaseous starting materials is lower than 0.001% by weight, the amount of the fine particles produced becomes extremely small, and when the concentration of the gaseous starting materials is higher than 40% by weight, the aggregates of the gaseous starting material molecules themselves and the adhesion of the resulting fine particles to the wall surface of the inner cylinder and the outer cylinder vigorously takes place, thereby making the size of the resulting fine particles uneven, which in turn makes the yield poor.

In the method of the present invention, by introducing the core fine particles into the reaction space, the core fine particles are coated with ceramics formed by reaction of the gaseous starting materials, so that fine particles having a multi-layered structure can be produced. The core fine particles refer to ones comprising inorganic substances such as metals and ceramics, organic substances, or composites thereof, each of which having a size which can shift in the reaction space by using the carrier gas without sedimenting therein. Examples thereof include $TiO_2$ fine particles, mica fine particles, iron particles, and polymer beads.

The carrier gas for conveying the core fine particles refers to an inert gas, or any gases which do not inhibit the progress of the chemical reaction of the gaseous starting materials in the reaction space, and, for instance, helium, air, nitrogen, etc. may be used as in the case of the carrier gas for conveying gaseous starting materials. The amount of flow of the carrier gas is preferably adjusted so that a total amount of flow of the carrier gas including the carrier gas for conveying gaseous starting materials is an amount not more than that which may break the Taylor vortex flow, which is an annular vortex in a vapor phase, and the residence time of the carrier gas containing the gaseous starting materials and the core fine particles in the reaction space becomes not shorter than 1 second.

The core fine particles can be supplied to the reaction space through a feed opening 12 arranged at the inlet (top portion) of the reaction space, as shown in FIG. 2. Although the feed opening 12 for supplying core fine particles is usually arranged near the inlet of the reaction space as mentioned above, any embodiments may be acceptable, as long as the ceramic formed by the reaction of the gaseous starting materials can coat the surface of the core fine particles. The position of the feed opening is suitably selected relative to the position of the feed opening for supplying gaseous starting materials. The feed opening may be arranged on the wall portion of the outer cylinder near the inlet.

In applications where not only the properties of the coating ceramic material but also the properties of the core fine particles have to be strongly exhibited, the ceramic coating to the surface of the core fine particles may be preferably partial. In order to obtain the ceramic fine particles having a multi-layered structure mentioned above, the feed opening for supplying core fine particles may be arranged at a position away from the inlet along the axial direction of the inner cylinder. Specifically, the feed opening for supplying core fine particles may be arranged on the wall surface of the outer cylinder near the center thereof, and the distance from the inlet of the reaction space may be suitably selected according to the desired ceramic fine particles.

The core fine particles are preferably introduced into the reaction space while being dispersed in a carrier gas using a powder supply dispersion device, or the like, so that an even coating is provided by allowing the surface of the core fine particles to sufficiently contact the vapor phase. The dispersion concentration is desirably from $10^2$ to $10^{20}$ particles/$m^3$. When the concentration is at conditions of higher than $10^{20}$ particles/$m^3$, the degree of dispersion of the core particles lowers, and when the concentration is at conditions of lower than $10^2$ particles/$m^3$, productivity of the resulting coated particles drastically decreases.

The ceramic formed by the reaction of the gaseous starting materials coats the surface of the core fine particles in the forms of atoms, molecules, or radicals thereof, or aggregates thereof, the ceramics being laminated to form a coat layer. Although the structure of the coat layer may vary depending on the coating state and the reaction space conditions, the coat layer usually has a substantially uniform laminar structure. In certain cases depending on the position of the feed opening for supplying core fine particles, the ceramic may form aggregates of partially uniformly coated fine particles.

The gaseous starting materials may be introduced through a single feed opening 9, as shown in FIG. 1. Alternatively, as shown in FIG. 3, the gaseous starting materials may be supplied stepwise into the reaction space by providing two or more feed openings, for example, feed openings 9a and 9b. In the latter case, the gaseous starting materials supplied from the feed opening arranged at the inlet of the reaction space are subjected to reaction to produce core-forming ceramic, and then another kind of gaseous starting materials are supplied in one-step or multi-steps from feed openings arranged at a position away from the inlet along the axial direction of the inner cylinder, to sequentially coat core-forming particles with the ceramics produced by each of the reactions in the reaction space to give fine particles having a multi-layered structure.

When two or more feed openings for supplying gaseous starting materials are provided, they are preferably arranged at such a position that the reaction of the gaseous starting materials supplied in the previous step are substantially progressed, so that the mixing of materials in each of the coat layers constituting the fine particles having a multi-layered structure can be reduced. The reaction rate is preferably not less than 80%, more preferably not less than 90%.

In the formed fine particles produced in the process of producing the fine particles having a multi-layered structure, the surface of the fine particles is coated with substances in the forms of atoms, molecules, or radicals thereof, or aggregates thereof which are formed by the reaction of the gaseous starting materials, and the coat layers are sequentially formed as the coated fine particles are transferred to a portion away from the inlet in the reaction space. Although the structure of the coat layers may vary depending on coating conditions and reaction space conditions, the coat layers usually have a substantially uniform laminar structure. In certain cases depending on the positions of the feed openings for supplying gaseous starting materials arranged at positions away from the inlet, the ceramic may form aggregates of partially uniformly coated fine particles.

In the above-mentioned coaxial, double-cylinder reaction apparatus, since the flow rate near the rotating inner cylinder is greater than the flow rate near the outer cylinder, the centrifugal force of the fluid mass rotating near the inner cylinder becomes greater than the centrifugal force of the fluid mass rotating near the outer cylinder. Therefore, the fluid mass near the inner cylinder is discharged as a discharged flow in the direction of the outer cylinder, while the fluid mass near the outer cylinder flows toward the inner cylinder as a return flow. The discharged flow and the returned flow constitute the Taylor vortex flows in the reaction space. These vortex flows are independent from each other with substantially no mixing of the vortex flows with each other. Therefore, the gaseous starting materials introduced from the inlet of the reaction space are mixed in the Taylor vortex flows, so that the temperature and the concentration of the gaseous starting materials in the vortex flows become even. In addition, if the introduction speed of the gaseous starting materials is kept constant, the residence time in the reaction space of the gaseous starting materials in each of the vortex flows becomes constant.

In the coaxial, double-cylinder reaction apparatus, the conditions required for forming the Taylor vortex flow in the reaction space in the case of giving an axial flow include a radius of an inner cylinder, a width of the annular portion between the inner and outer cylinders, a viscosity of the vapor phase, a rotational angular velocity of an inner cylinder, and an axial velocity in a vapor phase. The formation of Taylor vortex flow is determined by the combination of each of the conditions, and the generating conditions of the Taylor vortex flow and the conditions for passing the Taylor vortex flow through the reaction space of the coaxial, double-cylinder reaction apparatus without breaking the vortex flow are defined by a Taylor number and a Reynolds number, respectively, as expressed in the following equations.

$$Ta = (Ri \cdot \omega \cdot d/\nu)(d/Ri)^{1/2}$$

$$Re = d \cdot u/\nu$$

(In the equations, Ta stands for a Taylor number; Ri stands for a radius of an inner cylinder; $\omega$ stands for a rotational angular velocity of an inner cylinder; Re stands for a Reynolds number; d stands for a width of an annular portion between the inner and outer cylinders; $\nu$ stands for kinematic viscosity of the vapor phase; and u is an axial velocity in the vapor phase.)

In the present invention, as for the generating conditions of the Taylor vortex flow, the Taylor number is preferably in the range of from 40 to 15,000, more preferably in the range of from 70 to 10,000, and particularly preferably in the range of from 100 to 5,000. The reasons for the limitations are as follows. When the Taylor number is less than 40, the Taylor vortex flow is not generated, and when the Taylor number is greater than 15,000, the vortex structure is broken.

In Embodiment A of the present invention, the rotational angular velocity of the inner cylinder is controlled so as to form the Taylor vortex flow mentioned above.

In addition, as for the conditions for passing through the reaction space of the coaxial, double-cylinder reaction apparatus without breaking the Taylor vortex flow generated under the above-mentioned conditions, the Reynolds number is preferably in the range of greater than 0.05 and not more than 2,000, and desirably in the range of from 0.5 to 500. The reasons for limitations are as follows. When the Reynolds number is less than 0.05, the flow amount of the carrier gas becomes small, thereby reducing the production efficiency. In addition, when the Reynolds number is greater than 2,000, the Taylor vortex flow is subject to an axial flow and thus is broken.

In Embodiment A of the present invention, the rotational angular velocity of the inner cylinder and the axial velocity of the vapor phase are preferably controlled so that the Taylor number and the Reynolds number are in the ranges of, respectively, from 40 to 15,000 and from 0.05 to 2,000.

As long as the Taylor number and the Reynolds number are within the above ranges, the generating conditions of the Taylor vortex flow and the conditions for passing through the reaction space of the coaxial, double-cylinder reaction apparatus without breaking the Taylor vortex flow in the present invention can be satisfied; in other words, the formation conditions of the Taylor vortex flow in the reaction space can be satisfied.

Also, although the pressure inside the reaction space is not limited, it is desirably a normal pressure or a positive pressure in order to increase the stability of the vortex flow by increasing the densities of the gaseous starting materials.

The ceramic fine particles obtained by Embodiment A of the present invention has a good monodisperse property, and the surface of fine particles is clean. Also, by adjusting the concentration of the gaseous starting materials or the residence time of the gases in the reaction space, those having a particle diameter in the range of from 0.001 to 10 µm can be obtained. When taking into consideration the functional improvements of producing fine particles, those having a particle diameter of from 0.001 to 1 µm are desired. Incidentally, the particle diameter of the ceramic fine particles may be measured by various methods, including, for instance, a scanning or transmission electron microscope.

In addition, when the fine particles having a multi-layered structure are produced, the particles having uniform coat layers can be obtained in addition to the features mentioned above. The thickness of each of the coat layers may be expressed in term of the ratio of dp/Dp, wherein dp stands for the particle diameter of the portion comprising an inner side of the coat layer, and Dp stands for the particle diameter of the portion including the coat layer, and dp/Dp is preferably in the range of from 0.5 to 0.9999. When dp/Dp is less than 0.5, the properties of the portion comprising an inner side of the coat layer cannot be expected to affect the external portion via the coat layer, and when dp/Dp exceeds 0.9999, the formation of the coat layer is insufficient, so that the coat layer cannot be expected to fully exhibit the properties thereof.

As explained above, uniform ceramic fine particles can be easily produced by the steps of supplying gaseous starting materials formed by vaporizing one or more kinds of metal compounds into the reaction space of the coaxial, double-cylinder reaction apparatus with a carrier gas, and subjecting the gaseous starting materials to reaction under the formation conditions of the Taylor vortex flow. Also, according to the method of the present invention, since the Taylor vortex flow effectively inhibits the adhesion of the formed fine particles to the wall surface of the inner cylinder and the outer cylinder by a scratch-off effect of the vortex flow, the ceramic fine particles can be produced at a high yield.

Embodiment B

Embodiment B of the present invention will be explained in detail hereinbelow referring to the drawing.

Figure 5:
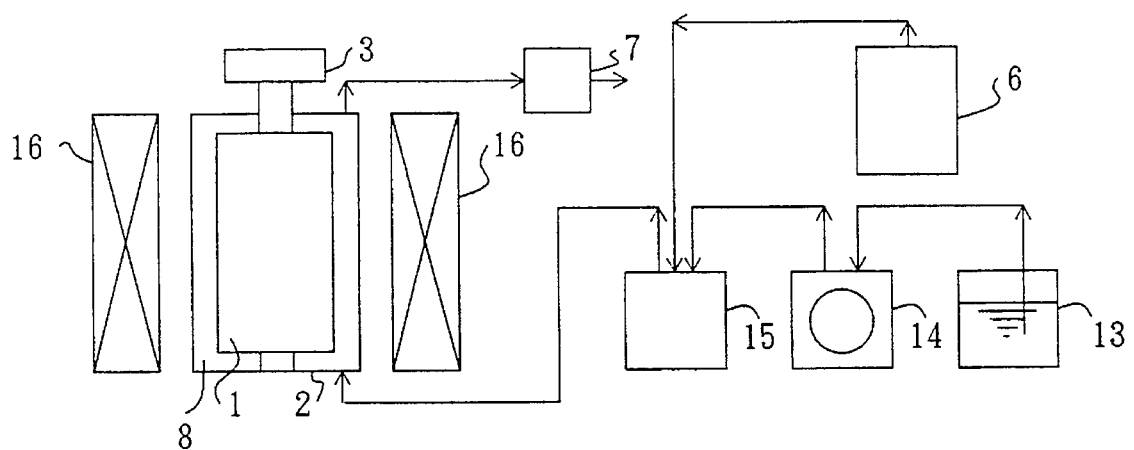
FIG. 5 is a schematic view showing an example of an apparatus for producing ceramic fine particles in Embodiment B of the present invention.

FIG. 5 is a schematic view showing an example of an apparatus used in Embodiment B of the present invention.

A solution containing one or more kinds of metal salts contained in a vessel 13 is continuously supplied into a device 15 for atomizing starting materials to generate fine droplets by using a circulation pump 14 for conveying fluids (hereinafter simply referred to as "starting material droplets"), and the obtained starting material droplets are introduced into a coaxial, double-cylinder reaction apparatus with a carrier gas supplied from a device 6 for supplying a carrier gas, the reaction apparatus having a stationary outer cylinder 2 and a rotatable inner cylinder 1. At this time, the inner cylinder is being rotated by a motor device 3 for rotating an inner cylinder. By setting the rotational angular velocity of the inner cylinder and the axial velocity of the vapor phase containing the starting material droplets at suitable values in the gap (a reaction space 8) formed between the inner cylinder 1 and the outer cylinder 2, a Taylor vortex flow, which is an annular vapor-phase vortex flow, can be formed. The Taylor vortex flow is in a state of a vapor-liquid mixed phase at the inlet, and as the Taylor vortex flow shifts toward the outlet, the starting material droplets contained in the Taylor vortex flow are energized by a thermal energy supplying device 16 for supplying thermal energy required for pyrolyric reaction, and the starting material droplets are subjected to pyrolyric reaction to form ceramic fine particles. The fine particles in the vapor phase coming out from a reaction space 8 are collected by a device 7 for collecting fine particles.

The vessels 13 are not particularly limited in their shapes, sizes, and materials, as long as the solution used as the starting materials containing one or more kinds of metal salts (hereinafter simply referred to as "starting material solution") can be stably stored.

The circulation pumps 14 for conveying fluids are not particularly limited, and a constant-feeding pump capable of supplying a starting material solution at a given amount is preferred.

Examples of the devices 15 for atomizing starting materials include atomization devices utilizing ultrasonic vibration and two fluid-type pressure spraying devices, and the atomization devices utilizing ultrasonic vibration are preferred in order to obtain droplets having a narrow droplet diameter distribution and a fine size.

The device 6 for supplying a carrier gas may be any ones which can supply a given amount of flow of the carrier gas for a long period of time, as in the case of Embodiment A. As for a device for controlling an amount of flow of the carrier gas, for instance, a mass flow meter may be used.

The coaxial, double-cylinder reaction apparatus comprises, as in the case of Embodiment A, a stationary outer cylinder 2 and a rotatable inner cylinder 1, and an annular portion formed in a gap between the inner cylinder and the outer cylinder is used as a reaction space 8. As for materials for the apparatus, stainless steel, ceramics, silica glass, etc. can be used.

The motor device 3 for rotating an inner cylinder is a device which can make the inner cylinder rotate at a given speed for a long period of time as in the case of Embodiment A, and for instance, a motor used in an invertor control may be preferably used.

As for thermal energy supplying devices 16 for supplying thermal energy required for pyrolytic reaction, temperature-controllable high-temperature heating members (electric furnace, etc.) may be preferably used.

Examples of the pyrolyric reactions include the following:
1) $Ti(SO_4)_2 \rightarrow TiO_2 + SO_x$;
2) $Zn(NO_3)_2 \rightarrow ZnO + NO_x$;
3) $Si(CH_3)_4 \rightarrow SiC + 3CH_4$; and
4) $[TiCl(NH_3)_5]Cl_2 \rightarrow TiN + 3HCl + 4NH_3$ Also, as for the temperature distribution in the reaction space in this coaxial, double-cylinder reaction apparatus, the device 16 for supplying thermal energy has to be temperature-controlled so that the isothermal portions can be kept as wide as possible along the axial directions and radial directions. The temperature of the reaction space may be suitably set depending upon the types of the metal salts and the solvents used, and the temperature is preferably in the range of from 50 to 2,000° C., more preferably in the range of from 100° to 1,500° C., and particularly preferably in the range of from 300° to 1,300° C. When the temperature of the reaction space is less than 50° C., the rate for the pyrolytic reaction is low, and when the temperature exceeds 2,000° C., rapid evaporation of the solvent takes place, thereby making it undesirably difficult to control the particle diameter.

As for the device 7 for collecting fine particles, a filter-type or electrostatic-type collector is effectively used as in the case of Embodiment A, with a preference given to an electric dust collector or a diffusion charge-type electrostatic collector for a long-term operation.

Next, the method for producing the ceramic fine particles of the present invention using the apparatus in Embodiment B of the present invention mentioned above will be explained.

The starting material droplets used in the present invention comprises droplets formed from a starting material solution containing one or more kinds of metal salts. The metal elements used in the metal salts are specifically alkali metals, alkaline earth metals, transition metals, etc., as in the case of Embodiment A. Examples thereof include alkali metals, such as Li, Na, K, Rb, Cs, and Fr; alkaline earth metals, such as Be, Mg, Ca, Sr, Ba, and Ra; and transition metals including elements in the fourth series of the periodic table, such as Sc, Ti, V, Cr, Mn, Fe, Co, Ni, Cu, Zn, Ga, Ge, and As; elements in the fifth series, such as Y, Zr, Nb, Mo, Tc, Ru, Rh, Pd, Ag, Cd, In, Sn, and Sb; elements in the sixth series, such as La, Hf, Ta, W, Re, Os, Ir, Pt, Au, Hg, Tl, Pb, and Bi; and other elements, such as Al and Si.

Also, kinds of metal salts include hydrochlorides, nitrates, phosphates, carbonates, acetates, double salts comprising two or more kinds of salts, and complex salts comprising complex ions, each of which may be in the form of an anhydride or a hydrate. Specific examples of the metal salts include $Ti(SO_4)_2$, $CuSO_4 \cdot 5H_2O$, $Zn(NO_3)_2 \cdot 6H_2O$, $Ca(NO_3)_2 \cdot 4H_2O$, $CaCl_2$, $MgCO_3$, $Fe_3(PO_4)_2$, $Cu(CH_3COO)_2$, double salts such as $KMgCl_3$ and $AlK(SO_4)_2$, and complex salts such as $K_3[Fe(CN)_6]$ and $[CoCl(NH_3)_5]Cl_2$.

These metal salts may be used singly or as a mixture. In the case where a mixture, for instance, a mixture of a titanate and a zinc salt, is used, either a mixture of zinc oxide and titanium oxide or a composite, which is zinc titanate ($Zn_2TiO_4$) can be obtained depending upon the temperature of the pyrolytic reaction.

Also, the solvents for the metal salts used in the preparation of the starting material solution may be water or organic solvents. Examples of the organic solvents include alcohols such as methanol and ethanol and polar solvents such as N,N-dimethylformamide, dimethyl sulfoxide, and hexamethylphosphylamide.

The concentration of the metal salts in the starting material droplets is preferably in the range of from $10^{-5}$ mol/L to 20 mol/L, desirably in the range of from $10^{-4}$ mol/L to 10 mol/L. The reasons for limitations are as follows. When the concentration of the metal salts in the starting material droplets is lower than $10^{-5}$ mol/L, the amount of the metal oxide fine particles produced becomes extremely small, and when the concentration is higher than 20 mol/L, the viscosity of the starting material solution for forming the droplets become excessively high, thereby making it difficult to produce fine droplets.

The average droplet diameter of the starting material droplets is in the range of normally from 0.1 to 100 μm, preferably from 0.1 to 50 μm, and those droplets having as a narrow droplet diameter distribution as possible are preferred. When the average droplet diameter is less than 0.1 μm, it is generally not easy to practically produce droplets of this order, and when the average droplet diameter exceeds 100 μm, the diameter of the formed fine particles is in the order of about several dozen micrometers at its smallest size, so that the production of the fine particles become difficult. Incidentally, the average droplet diameter is preferably measured in the state of a vapor-liquid mixed phase, and for instance, it can be measured by a device for measuring light scattering-type diameter distribution.

The concentration of the starting material droplets supplied is desirably from $10^2$ to $10^{11}$ particles/m$^3$, based on the carrier gas. When the concentration is at conditions of higher than $10^2$ particles/m$^3$, the aggregates are likely to be formed with the droplets themselves, and when the concentration is at conditions of lower than $10^{11}$ particles/m$^3$, the productivity of the fine particles lowers.

The carrier gas refers to an inert gas, or any gases which do not inhibit the progress of the pyrolyric reaction, and for instance, helium, air, nitrogen, etc. may be used. The amount of flow of the carrier gas is preferably adjusted so that the amount of flow of the carrier gas is an amount not more than that which may cause to break the Taylor vortex flow, which is an annular, vapor-phase vortex, and the residence time of the carrier gas containing the starting material droplets in the reaction space becomes not shorter than 1 second.

In the above-mentioned coaxial, double-cylinder reaction apparatus, as explained in Embodiment A, since the flow rate near the rotating inner cylinder is greater than the flow rate near the outer cylinder, the centrifugal force of the fluid mass rotating near the inner cylinder becomes greater than the centrifugal force of the rotating fluid mass near the outer cylinder. Therefore, the fluid mass near the inner cylinder is discharged as a discharged flow in the direction of the outer cylinder, while the fluid mass near the outer cylinder flows toward the inner cylinder as a return flow. The discharged flow and the returned flow constitute the Taylor vortex flows in the reaction space. These vortex flows are independent from each other with substantially no mixing of the vortex flows with each other. Therefore, the starting material droplets introduced from the inlet of the reaction space are mixed in the Taylor vortex flows, so that the temperature and the densities of the starting material droplets in the vortex flows become even. In addition, if the introduction speed of the starting material droplets is kept constant, the residence time in the reaction space of the starting material droplets in each of the vortex flows becomes constant.

As explained in Embodiment A, the formation of the Taylor vortex flow in the present invention refers to the conditions for generating the Taylor vortex flow in the reaction space and for passing the vortex flow through the reaction space without breaking the generated vortex flow. In the coaxial, double-cylinder reaction apparatus, the conditions required for generating the Taylor vortex flow in the reaction space in the case of giving an axial flow include a width of the annular portion between the inner and outer cylinders, a kinematic viscosity of the vapor phase containing starting material droplets, a rotational angular velocity of an inner cylinder, and an axial velocity in a vapor phase. Specifically, the rotational angular velocity of the inner cylinder is controlled so as to generate the Taylor vortex flow in the vapor phase containing the starting material droplets in the reaction space.

The generation of Taylor vortex flow is determined by the combination each of the conditions, and the conditions for generating the Taylor vortex flow and the conditions for passing the vortex flow through the reaction space of the coaxial, double-cylinder reaction apparatus without breaking the vortex flow are satisfied by controlling the rotational angular velocity of the inner cylinder and the axial velocity of the vapor phase containing the starting material droplets so as to have the Taylor number and the Reynolds number in given ranges. Here, the Taylor number and the Reynolds number, respectively, are expressed in the following equations.

$$Ta = (Ri \cdot \omega d/v)(d/Ri)^{1/2}$$

$$Re = d \cdot n'/v'$$

(In the equations, Ta stands for a Taylor number; Ri stands for a radius of an inner cylinder; ω stands for a rotational angular velocity of an inner cylinder; Re stands for a Reynolds number; d stands for a width of an annular portion between the inner and outer cylinders; v' stands for kinematic viscosity in the vapor phase containing starting material droplets; and u' is an axial velocity in the vapor phase containing starting material droplets.)

Specifically, as in the case of Embodiment A, as for the generating conditions of the Taylor vortex flow, the Taylor number is preferably in the range of from 40 to 15,000, more preferably in the range of from 70 to 10,000, and particularly preferably in the range of from 100 to 5,000. The reasons for the limitations are as follows. When the Taylor number is less than 40, the Taylor vortex flow is not generated, and when the Taylor number is greater than 15,000, the vortex structure is broken.

In addition, as in the case of Embodiment A, as for the conditions for passing through the reaction space of the coaxial, double-cylinder reaction apparatus without breaking the Taylor vortex flow generated under the above-mentioned conditions, the Reynolds number is preferably in the range of greater than 0.05 and not more than 2,000, and desirably in the range of from 0.5 to 500. The reasons for limitations are as follows. When the Reynolds number is less than 0.05, the flow amount of the carrier gas becomes small, thereby reducing the production efficiency. In addition, when the Reynolds number is greater than 2,000, the Taylor vortex flow is subject to an axial flow and thus is broken.

In Embodiment B of the present invention, as in the case of Embodiment A, the rotational angular velocity of the inner cylinder and the axial velocity of the vapor phase are preferably controlled so that the Taylor number and the Reynolds number, respectively, are in the ranges of from 40 to 15,000 and from 0.05 to 2,000.

As long as the Taylor number and the Reynolds number are within the above ranges, the generating conditions of the Taylor vortex flow and the conditions for passing through the reaction space of the coaxial, double-cylinder reaction apparatus without breaking the Taylor vortex flow in the present invention can be satisfied; in other words, the formation conditions of the Taylor vortex flow in the reaction space can be satisfied.

Also, although the pressure inside the reaction space is not limited, it is desirably a normal pressure or a positive pressure in order to increase the stability of the vortex flow by increasing the densities of the starting material droplets.

The ceramic fine particles obtained by Embodiment B of the present invention has good monodisperse property. Also, by setting the suitable conditions in the concentration of the spraying solution, the types of devices for atomizing starting materials, the amount of flow of the carrier gas, and the temperature inside the reaction space, the ceramic fine particles having a particle diameter in the range of from 0.01 to several dozen micrometers can be obtained. When taking into consideration the yield of the fine particles produced and the functional improvements of producing fine particles, those having a particle diameter of from 0.05 to 5 µm are desired. Incidentally, the particle diameter of the ceramic fine particles may be measured by various methods, including, for instance, a scanning or transmission electron microscope.

Also, in Embodiment B of the present invention, porous ceramic fine particles can be easily produced.

As explained above, uniform ceramic fine particles can be easily produced by the steps of supplying starting material droplets, which are produced by forming droplets with a solution containing one or more kinds of metal salts, into the reaction space of the coaxial, double-cylinder reaction apparatus with a carrier gas, and subjecting the starting material droplets to reaction under the formation conditions of the Taylor vortex flow. Also, according to the method of the present invention, since the Taylor vortex flow effectively inhibits the adhesion of the formed fine particles to the wall surface of the inner cylinder and the outer cylinder by a scratch-off effect of the vortex flow, the ceramic fine particles can be produced at a high yield.

As explained above, according to the production methods of Embodiment A or Embodiment B in the present invention, by utilizing the Taylor vortex flow as the flow for a CVD reaction field or a pyrolyric reaction field, uniform ceramic fine particles can be continuously produced at a high yield and a low cost because of an even temperature distribution, an even concentration distribution of the reaction gases, an even concentration distribution of the droplet number in the vortex flow, and residence time of the resulting fine particles enveloped in the vortex flow. In the present invention, either of Embodiment A and Embodiment B can be utilized. Embodiment A is preferred particularly in the case for producing the ceramic fine particles having a multi-layered structure, and Embodiment B is preferred in the case for producing porous ceramic fine particles.

The present invention is hereinafter described in more detail by means of the following Examples and Comparative Examples, but the present invention is not by any means limited to these examples.

EXAMPLE 1

The reaction apparatus shown in FIG. 1 was used to produce ceramic fine particles. Specifically, titanium tetraisopropoxide ($Ti(OC_3H_7)_4$) was evaporated at 50° C. using an evaporator. By using a nitrogen carrier gas (kinematic viscosity of the nitrogen gas being 0.98 $cm^2/s$ at 600° C.) controlled at a flow rate of 10 L/min, the obtained vapor was supplied to the reaction space existing in the gap of the inner and outer cylinders from a bottom portion up of a coaxial, double-cylinder reaction apparatus (made of stainless steel, inner cylinder diameter of 100 mm, outer cylinder diameter of 133 mm, width of 16.5 mm and length of 57 cm of annular portion between the inner and outer cylinders), the reaction apparatus being temperature-controlled at 600° C. using a heating furnace arranged outside of the outer cylinder. Formation conditions of Taylor vortex flow were maintained by controlling the peripheral speed of the outer surface of the inner cylinder at 262 cm/s (inner cylinder rotational speed 500 rpm). The gaseous starting material was pyrolyzed while passing through the reaction space, to give $TiO_2$ fine particles, and the $TiO_2$ fine particles contained in the vapor phase were collected using a diffusion charge-type electrostatic collector attached immediately outside the outlet of the reaction space.

Incidentally, at this time, the concentration of the gaseous starting material was 0.16% by weight, based on the nitrogen carrier gas, determined by measuring the amount of starting material evaporated by means of gravimetric analysis. Also, the average residence time of the gaseous starting material in the reaction space was about 21 seconds. The Taylor number was 358, and the Reynolds number was 4.6, satisfying the formation conditions of the Taylor vortex flow mentioned above.

The $TiO_2$ fine particles obtained by the above-mentioned conditions have a crystalline phase comprising anatase which was partially mingled in an amorphous phase. The diameter of the $TiO_2$ fine particles was about 0.03 µm in average diameter (number basis). Also, as for the particle diameter distribution, 15% of the particles fell in the range of from 0.01 to 0.02 µm, 70% of the particles in the range of from 0.02 to 0.04 µm, 10% of the particles in the range of from 0.04 to 0.06 µm, and 5% of the particles in the range of from 0.06 to 0.10 µm.

In addition, the yield (weight ratio) of the $TiO_2$ fine particles collected using a filter was 98%.

Incidentally, the crystalline phase of the formed $TiO_2$ fine particles was measured with an X-ray diffractometer. Also, the particle diameter was measured using a scanning electron microscope. The measurements were taken in the same manner in the following Examples and Comparative Examples.

Comparative Example 1

The same reaction apparatus and conditions as those used in Example 1 were used to carry out a production experiment of fine particles by pyrolyzing gaseous starting materials in a piston flow, without rotating the inner cylinder, namely without producing the Taylor vortex flow.

The $TiO_2$ fine particles obtained by the above-mentioned conditions have a crystalline phase comprising anatase which was partially mingled in an amorphous phase. The diameter of the $TiO_2$ fine particles was about 0.04 μm in average diameter (number basis). Also, as for the particle diameter distribution, 20% of the particles fell in the range of from 0.01 to 0.02 μm, 40% of the particles in the range of from 0.02 to 0.04 μm, 30% of the particles in the range of from 0.04 to 0.06 μm, and 10% of the particles in the range of from 0.06 to 0.10 μm. Their particle diameter distribution was wider and their monodisperse property was poorer than that obtained in Example 1, wherein the fine particles were produced under formation conditions of Taylor vortex flow.

The yield (weight ratio) of the $TiO_2$ fine particles collected using a filter was 83%, because the $TiO_2$ fine particles adhered to the walls of the inner and outer cylinders. This yield was lower than that obtained in Example 1, wherein the fine particles were produced under formation conditions of Taylor vortex flow.

Example 2

The reaction apparatus shown in FIG. 2 was used to produce multi-layered ceramic fine particles. The kinds and vaporizing temperatures of the gaseous starting materials, and the temperature, dimensions, and shape of the reaction space, and the rotational speed of the inner cylinder were the same as those used in Example 1. By using a carrier nitrogen gas controlled at a flow rate of 5 L/min, the obtained vapor was supplied into the reaction space through a feed opening 9 arranged at the top portion of the reaction space, and then mica fine particles (platy, average diameter of about 5 μm, average thickness of about 0.25 μm) in a nitrogen gas-dispersed state (about $5\times10^{10}$ particles/m³) were supplied into the reaction space similarly through the feed opening 12 arranged at the top portion using a powder supply dispersion device. The flow rate of the nitrogen gas containing the mica fine particles was controlled at 1 L/min. $TiO_2$ produced by pyrolysis of the gaseous starting material while passing through the reaction space was applied to the surface of the mica fine particles. The $TiO_2$-coated mica fine particles contained in the gas coming out from the bottom portion of the reaction space were collected in the same manner as in Example 1.

Incidentally, at this time, the concentration of the gaseous starting material was 0.17% by weight, based on the nitrogen carrier gas, and the average residence time of the gaseous starting material in the reaction space was about 36 seconds. The Taylor number was 358, and the Reynolds number was 2.8, satisfying the formation conditions of the Taylor vortex flow mentioned above.

As a result of an X-ray diffraction analysis, in the $TiO_2$-coated mica fine particles obtained by the above-mentioned conditions, it was found that the $TiO_2$ coat layer has a crystalline phase comprising anatase which was partially mingled in an amorphous phase. As a result of observing the cross section of the fine particles using transmission electron microscope, the coat layer had a uniform, layered structure whose average thickness was about 0.11 μm. Also, the ratio of the particle diameter dp of the mica fine particles to the particle diameter Dp of the $TiO_2$-coated mica fine particles, namely dp/Dp, was 0.98. In addition, as for the thickness distribution of the coat layer, 2% of the particles fell in the range of not more than 0.08 μm, 10% of the particles in the range of from 0.08 to 0.10 μm, 72% of the particles in the range of from 0.10 to 0.12 μm, 13% of the particles in the range of from 0.12 to 0.14 μm, and 3% of the particles in the range of not less than 0.14 μm. As for the appearance of the fine particles, the overall color was beige having brilliant pearly luster, and the coloring was uniform in the entire fine particles.

In addition, the yield (weight ratio) of the $TiO_2$-coated mica fine particles collected using a filter was 97%.

Comparative Example 2

The same reaction apparatus and conditions as those used in Example 2 were used to carry out a formation experiment of fine particles by pyrolyzing gaseous starting materials in a piston flow, without rotating the inner cylinder, namely without producing the Taylor vortex flow.

In the $TiO_2$-coated mica fine particles obtained by the above-mentioned conditions, the $TiO_2$ coat layer has a crystalline phase comprising anatase which was partially mingled in an amorphous phase. The average thickness of the coat layer was about 0.09 μm. Also, as for the thickness distribution of the coat layer, 10% of the particles fell in the range of not more than 0.06 μm, 23% of the particles in the range of from 0.06 to 0.08 μm, 45% of the particles in the range of from 0.08 to 0.10 μm, 14% of the particles in the range of from 0.10 to 0.12 μm, and 8% of the particles in the range of not less than 0.12 μm. The thickness distribution of the coat layer was wider and the monodisperse property of the fine particles was poorer than that obtained in Example 2, wherein the fine particles were produced under formation conditions of Taylor vortex flow.

The yield (weight ratio) of the $TiO_2$-coated mica fine particles collected using a filter was 87%, because the formed fine particles adhered to the walls of the inner and outer cylinders. This yield was lower than that obtained in Example 2, wherein the fine particles were produced under formation conditions of Taylor vortex flow.

EXAMPLE 3

The reaction apparatus shown in FIG. 3 was used to produce multi-layered ceramic fine particles. The temperature, dimensions, and shape of the reaction space, and the rotational speed of the inner cylinder were the same as those used in Example 1. Aluminum isopropoxide ($Al(OC_3H_7)_3$) was evaporated at 100° C. using an evaporator 5a. By using a carrier nitrogen gas controlled at a flow rate of 1 L/min, the obtained vaporized aluminum isopropoxide was supplied into the reaction space through a feed opening 9a arranged at the bottom portion of the reaction space. Further, titanium tetraisopropoxide was evaporated at 50° C. using an evaporator 5b. By using a carrier nitrogen gas controlled at a flow rate of 1 L/min, the obtained vaporized titanium tetraisopropoxide was supplied into the reaction space through a feed opening 9b arranged at the wall portion of the outer cylinder (the distance between the top portion of the reaction space and the feed opening 9b being 10 cm). $TiO_2$ produced by pyrolysis of titanium tetraisopropoxide was applied on the surface of the $Al_2O_3$ fine particles, the $Al_2O_3$ fine particles being produced by pyrolysis of aluminum isopropoxide, to give $TiO_2$-coated $Al_2O_3$ fine particles. The coated fine particles contained in the gas coming out from the top portion of the reaction space were collected in the same manner as in Example 1.

Incidentally, at this time, as for the concentration of the gaseous starting materials, aluminum isopropoxide was 0.35% by weight, and titanium tetraisopropoxide was 0.17% by weight, based on the nitrogen carrier gas. The average residence time of the gaseous starting materials in the reaction space was about 188 seconds for aluminum isopropoxide and about 18 seconds for titanium tetraisopropoxide. The Taylor number was 358, and the Reynolds number was 0.46 for the portion between the bottom portion of the reaction space and the feed opening 9b, and 0.93 for the portion above the feed opening 9b, satisfying the formation conditions of the Taylor vortex flow mentioned above.

As a result of an X-ray diffraction analysis, in the $TiO_2$-coated $Al_2O_3$ fine particles obtained by the above-mentioned conditions, it was found that the $Al_2O_3$ core particles have a crystalline phase comprising a γ-type, somewhat close to an amorphous state, and the $TiO_2$ coat layer has a crystalline phase comprising anatase which was partially mingled in an amorphous phase. As a result of observing the fine particles using scanning electron microscope, the particle diameter was about 0.7 μm in average diameter (number basis). In addition, as for the particle diameter distribution, 2% of the particles fell in the range of not more than 0.5 μm, 9% of the particles in the range of from 0.5 to 0.6 μm, 45% of the particles in the range of from 0.6 to 0.7 μm, 28% of the particles in the range of from 0.7 to 0.8 μm, 12% of the particles in the range of from 0.8 to 0.9 μm, and 4% of the particles in the range of not less than 0.9 μm. As a result of observing the cross section of the fine particles using transmission electron microscope, both the $Al_2O_3$ core particle portion and the $TiO_2$ coat layer had uniform, layered structures, the structures being separated by clear grain boundaries formed therebetween. The average thickness of the coat layer was about 0.05 μm. Also, the ratio of the particle diameter dp of the $Al_2O_3$ core particles to the particle diameter Dp of the $TiO_2$-coated $Al_2O_3$ fine particles, namely dp/Dp, was 0.93. As for the thickness distribution of the coat layer, 1% of the particles fell in the range of not more than 0.03 μm, 7% of the particles in the range of from 0.03 to 0.04 μm, 46% of the particles in the range of from 0.04 to 0.05 μm, 41% of the particles in the range of from 0.05 to 0.06 μm, 5% of the particles in the range of from 0.06 to 0.07 μm, and 0% of the particles in the range of not less than 0.07 μm.

In addition, the yield (weight ratio) of the $TiO_2$-coated $Al_2O_3$ fine particles collected using a filter was 96%.

Comparative Example 3

The same reaction apparatus and conditions as those used in Example 3 were used to carry out a formation experiment of fine particles by prolyzing gaseous starting materials in a piston flow, without rotating the inner cylinder, namely without producing the Taylor vortex flow.

In the $TiO_2$-coated $Al_2O_3$ fine particles obtained by the above-mentioned conditions, it was found that the $Al_2O_3$ core particles have a crystalline phase comprising a γ-type, somewhat close to an amorphous state, and the $TiO_2$ coat layer has a crystalline phase comprising anatase which was partially mingled in an amorphous phase. The particle diameter was about 0.7 μm in average diameter (number basis). As for the particle diameter distribution, 4% of the particles fell in the range of not more than 0.5 μm, 15% of the particles in the range of from 0.5 to 0.6 μm, 33% of the particles in the range of from 0.6 to 0.7 μm, 26% of the particles in the range of from 0.7 to 0.8 μm, 18% of the particles in the range of from 0.8 to 0.9 μm, and 4% of the particles in the range of not less than 0.9 μm. The average thickness of the coat layer was about 0.05 μm. As for the thickness distribution of the coat layer, 13% of the particles fell in the range of not more than 0.03 μm, 15% of the particles in the range of from 0.03 to 0.04 μm, 28% of the particles in the range of from 0.04 to 0.05 μm, 23% of the particles in the range of from 0.05 to 0.06 μm, 14 of the particles in the range of from 0.06 to 0.07 μm, and 7% of the particles in the range of not less than 0.07 μm. Therefore, the diameter distribution of the coated particles and the thickness distribution of the coat layer were both wider, and the monodisperse property of the particle diameter and the evenness of the coat layer were poorer than those obtained in Example 3, wherein the fine particles were produced under formation conditions of Taylor vortex flow.

In addition, the yield (weight ratio) of the $TiO_2$-coated $Al_2O_3$ fine particles collected using a filter was 79%, because the formed fine particles adhered to the walls of the inner and outer cylinders. This yield was lower than that obtained in Example 3, wherein the fine particles were produced under formation conditions of Taylor vortex flow.

Example 4

The reaction apparatus shown in FIG. 4 was used to produce multi-layered ceramic fine particles. The temperature, dimensions, and shape of the reaction space, and the rotational speed of the inner cylinder were the same as those used in Example 1. Titanium tetraisopropoxide was evaporated at 50° C. using an evaporator 5a. By using a carrier nitrogen gas controlled at a flow rate of 1 L/min, the obtained vaporized titanium tetraisopropoxide was supplied into the reaction space through a feed opening 9a arranged at the top portion of the reaction space. In addition, $Fe_2O_3$ fine particles (average diameter about 0.9 μm) were supplied in the reaction space through a feed opening 12 similarly arranged at the top portion of the reaction space, the $Fe_2O_3$ fine particles being dispersed (about $10^{12}$ particles/$m^3$) in a nitrogen gas using a powder supply dispersion device. At this time, the flow rate of the nitrogen gas containing the above $Fe_2O_3$ fine particles was controlled at 1 L/min. Further, aluminum isopropoxide was evaporated at 100° C. using an evaporator 5b. By using a carrier nitrogen gas controlled at a flow rate of 1 L/min, the obtained vaporized aluminum isopropoxide was supplied into the reaction space through a feed opening 9b arranged at the wall portion of the outer cylinder (the distance between the top portion of the reaction space and the feed opening 9b being 10 cm). $TiO_2$ produced by pyrolysis of titanium tetraisopropoxide was applied on the surface of the $Fe_2O_3$ fine particles, and $Al_2O_3$ produced by pyrolysis of aluminum isopropoxide was applied on the outer side of the coat surface, to give fine particles having a multi-layered structure of $Fe_2O_3/TiO_2/Al_2O_3$. The fine particles having a multi-layered structure contained in the gas coming out from the bottom portion of the reaction space were collected in the same manner as in Example 1.

Incidentally, at this time, as for the concentration of the gaseous starting materials, titanium tetraisopropoxide was 0.17% by weight, and aluminum isopropoxide was 0.35% by weight, based on the nitrogen carrier gas. The average residence time of the gaseous starting materials in the reaction space was about 75 seconds for titanium tetraisopropoxide and about 57 seconds for aluminum isopropoxide. The Taylor number was 358, and the Reynolds number was 0.93 for the portion between the top portion of the reaction space and the feed opening 9b, and 1.4 for the portion below the feed opening 9b, satisfying the formation conditions of the Taylor vortex flow mentioned above.

As a result of an X-ray diffraction analysis, in the fine particles having a multi-layered structure of $Fe_2O_3$ /$TiO_2$/$Al_2O_3$ obtained by the above-mentioned conditions, it was found that the $TiO_2$ coat layer has a crystalline phase comprising anatase which was partially mingled in an amorphous phase, and the $Al_2O_3$ coat layer has a crystalline phase comprising a γ-type, somewhat close to an amorphous state. As a result of observing the cross section of the fine particles using transmission electron microscope, both the $TiO_2$ coat layer and the $Al_2O_3$ coat layer had uniform, layered structures, the structures being separated by clear grain boundaries formed therebetween. The average thickness of the $TiO_2$ coat layer was about 0.05 μm. Also, the ratio of the particle diameter dp of the $Fe_2O_3$ core particles to the particle diameter Dp including the portion of the $TiO_2$ coat layer, namely dp/Dp, was 0.89. As for the thickness distribution of the $TiO_2$ coat layer, 0% of the particles fell in the range of not more than 0.03 μm, 3% of the particles in the range of from 0.03 to 0.04 μm, 21% of the particles in the range of from 0.04 to 0.05 μm, 69% of the particles in the range of from 0.05 to 0.06 μm, 7% of the particles in the range of from 0.06 to 0.07 μm, and 0%. of the particles in the range of not less than 0.07 μm. The average thickness of the $Al_2O_3$ coat layer, constituting the outermost layer, was about 0.07 μm. Also, the ratio of the particle diameter dp of the portion excluding the $Al_2O_3$ coat layer to the particle diameter Dp of the entire fine particles having a multi-layered structure, namely dp/Dp, was 0.87. As for the thickness distribution of the $Al_2O_3$ coat layer, 1% of the particles fell in the range of not more than 0.04 μm, 20% of the particles in the range of from 0.04 to 0.06 μm, 76% of the particles in the range of from 0.06 to 0.08 μm, 3% of the particles in the range of from 0.08 to 0.10 μm, and 0% of the particles in the range of not less than 0.10 μm.

In addition, the yield (weight ratio) of the fine particles having a multi-layered structure of $Fe_2O_3$/$TiO_2$/$Al_2O_3$ which was collected using a filter was 95%.

Comparative Example 4

The same reaction apparatus and conditions as those used in Example 4 were used to carry out a formation experiment of fine particles by prolyzing gaseous starting materials in a piston flow, without rotating the inner cylinder, namely without generating the Taylor vortex flow.

In the fine particles having a multi-layered structure of $Fe_2O_3$ /$TiO_2$/$Al_2O_3$ obtained by the above-mentioned conditions, it was found that the $TiO_2$ coat layer has a crystalline phase comprising anatase which was partially mingled in an amorphous phase, and the $Al_2O_3$ coat layer has a crystalline phase comprising a γ-type, somewhat close to an amorphous state. The average thickness of the $TiO_2$ coat layer was about 0.05 μm. As for the thickness distribution of the $TiO_2$ coat layer, 6% of the particles fell in the range of not more than 0.03 μm, 13% of the particles in the range of from 0.03 to 0.04 μm, 24% of the particles in the range of from 0.04 to 0.05 μm, 37% of the particles in the range of from 0.05 to 0.06 μm, 15% of the particles in the range of from 0.06 to 0.07 μm, and 5% of the particles in the range of not less than 0.07 μm. The average thickness of the $Al_2O_3$ coat layer, constituting the outermost layer, was about 0.07 μm. As for the thickness distribution of the $Al_2O_3$ coat layer, 6% of the particles fell in the range of not more than 0.04 μm, 35% of the particles in the range of from 0.04 to 0.06 μm, 44% of the particles in the range of from 0.06 to 0.08 μm, 13% of the particles in the range of from 0.08 to 0.10 μm, and 2% of the particles in the range of not less than 0.10 μm. The thickness distributions of both the $TiO_2$ coat layer and the $Al_2O_3$ coat layer were wider, and the evenness of the coat layer was poorer than those obtained in Example 4, wherein the fine particles were produced under formation conditions of Taylor vortex flow.

In addition, the yield (weight ratio) of the fine particles having a multi-layered structure of $Fe_2O_3$/$TiO_2$/$Al_2O_3$ which was collected using a filter was 78%, because the formed fine particles adhered to the walls of the inner and outer cylinders. This yield was lower than that obtained in Example 4, wherein the fine particles were produced under formation conditions of Taylor vortex flow.

EXAMPLE 5

The reaction apparatus shown in FIG. 5 was used to produce zinc oxide fine particles. Zinc nitrate hexahydrate ($Zn(NO_3)_2 \cdot 6H_2O$) and purified water were added to prepare an aqueous solution of zinc nitrate to a concentration of $10^{-4}$ mol/L. By using a carrier nitrogen gas (kinematic viscosity of the nitrogen gas at 650° C. being 1.05 $cm^2$/s) controlled at a flow rate of 2 L/min, the aqueous solution was supplied to the gap (reaction space) between the inner and outer cylinders from a bottom portion of a coaxial double-cylinder reaction apparatus (made of stainless steel, inner cylinder diameter 100 mm, outer cylinder diameter 133 mm, width of 16.5 mm and length of 57 cm of annular portion between the inner and outer cylinders), the reaction apparatus being temperature-controlled at 650° C. using a heating furnace arranged outside the outer cylinder. Formation conditions of Taylor vortex flow were maintained by keeping the peripheral speed of the outer peripheral surface of the inner cylinder at 262 cm/s (inner cylinder rotational speed being 500 rpm). While shifting the Taylor vortex flow from the bottom portion to the top portion, starting material droplets (average droplet diameter 5 μm) were pyrolyzed to produce ZnO fine particles. The resulting ZnO fine particles obtained in a gas-solid mixed phase were collected using a diffusion charge type electrostatic particle collector attached immediately outside of the outlet of the reactor.

Here, the average droplet diameter was measured using a light scattering particle diameter distribution meter ("PARTICLE SIZER," manufactured by Nippon Laser K. K.). The average residence time of the gas in the reaction space was about 103 seconds. The Taylor number was 334, and the Reynolds number was 0.87, thereby satisfying the formation conditions of the Taylor vortex flow mentioned above.

The ZnO fine particles obtained by the above-mentioned conditions have a crystalline phase comprising hexagonal crystal system which was partially mingled in an amorphous phase. The ZnO particle diameter was about 0.2 μm in average diameter (number basis). As for the particle diameter distribution, 11% of the particles fell in the range of not more than 0.1 μm, 41% of the particles in the range of from 0.1 to 0.2 μm, 40% of the particles in the range of from 0.2 to 0.3 μm, and 8% of the particles in the range of not less than 0.3 μm.

In addition, the yield (weight ratio) of the ZnO fine particles which was collected using a filter was 92%.

Comparative Example 5

The same reaction apparatus and conditions as those used in Example 5 were used to carry out a formation experiment of fine particles by prolyzing starting material droplets in a piston flow, without rotating the inner cylinder, namely without producing the Taylor vortex flow.

The ZnO fine particles obtained by the above-mentioned conditions have a crystalline phase comprising hexagonal crystal system which was partially mingled in an amorphous phase. The ZnO particle diameter was about 0.2 μm in average diameter (number basis). As for the particle diameter distribution, 3% of the particles fell in the range of not more than 0.1 μm, 31% of the particles in the range of from 0.1 to 0.2 μm, 44% of the particles in the range of from 0.2 to 0.3 μm, and 22% of the particles in the range of not less than 0.3 μm. Therefore, the particle diameter distribution was wider, and the monodisperse property was poorer than those obtained in Example 5, wherein the fine particles were produced under formation conditions of Taylor vortex flow.

In addition, the yield (weight ratio) of the ZnO fine particles which was collected using a filter was 75%, because the formed fine particles adhered to the walls of the inner and outer cylinders. This yield was lower than that obtained in Example 5, wherein the fine particles were produced under formation conditions of Taylor vortex flow.

INDUSTRIAL APPLICABILITY

According to the present invention, by utilizing the Taylor vortex flow as the flow in a CVD reaction field or a pyrolyric reaction field, uniform ceramic fine particles can be produced at a high yield because of an even temperature distribution, and an even concentration distribution of the reaction gases or an even concentration distribution of the droplet number in the vortex flow, and residence time of the resulting fine particles enveloped in the vortex flow. Also, by supplying the core fine particles into the reaction space and supplying gaseous starting materials into the reaction space through two or more feed openings, fine particles having a multi-layered structure each of whose layers has a uniform thickness can be obtained at a high yield. Therefore, by employing a simple process of the present invention, various kinds of ceramic fine particles can be continuously produced at a high yield and a low cost.

We claim:

1. A method for producing ceramic particles having a particle diameter in the range of from 0.001 to 10 μm comprising the steps of vaporizing one or more metal compounds to give gaseous starting materials; supplying said gaseous starting materials with a carrier gas to a reaction space arranged in an annular portion between inner and outer cylinders of a coaxial, double-cylinder reaction apparatus, the reaction apparatus having a stationary outer cylinder and a rotatable inner cylinder; and subjecting said gaseous starting materials to reaction in said reaction space while rotating the inner cylinder.

2. The method according to claim 1, further supplying core particles to the reaction space with a carrier gas to coat the surface of said core particles with a ceramic produced by subjecting said gaseous starting materials to reaction.

3. The method according to claim 1, wherein different kinds of gaseous starting materials are supplied to the reaction space with a carrier gas through two or more feed openings arranged in the coaxial, double-cylinder reaction apparatus to form ceramic fine particles having a multi-layered structure comprising a ceramic produced by subjecting each of the gaseous starting materials to reaction.

4. The method according to claim 2, wherein different kinds of gaseous starting materials are supplied to the reaction space with a carrier gas through two or more feed openings arranged in the coaxial, double-cylinder reaction apparatus, and said core particles are supplied to the reaction space with a carrier gas, to form ceramic fine particles having a multi-layered structure comprising ceramic layers coated on said core particles, the ceramic layers being produced by subjecting each of the gaseous starting materials to reaction.

5. The method according to any one of claims 1 to 4, wherein the rotational angular velocity of the inner cylinder is controlled to form a Taylor vortex flow in a vapor phase inside the reaction space.

6. The method according to any one of claims 1 to 4, wherein the rotational angular velocity of the inner cylinder and the axial velocity of the vapor phase are controlled to have a Taylor number and a Reynolds number expressed by the following equations, respectively, in the ranges of from 40 to 15,000 and from 0.05 to 2,000.

$$Ta = (Ri \cdot \omega d/v)(d/Ri)^{1/2}$$

$$Re = d \cdot u/v$$

wherein Ta stands for a Taylor number; Ri stands for a radius of an inner cylinder; ω stands for a rotational angular velocity of an inner cylinder; Re stands for a Reynolds number; d stands for a width of an annular portion between the inner and outer cylinders; ν stands for kinematic viscosity of the vapor phase; and u is an axial velocity of the vapor phase.

7. The method according to any one of claims 1 to 4, wherein the concentration of the gaseous starting materials is 0.001 to 40% by weight, based on the carrier gas.

8. The method according to claim 2 or 4, wherein the concentration of the core fine particles is $10^2$ to $10^{20}$ particles/m$^3$, based on the carrier gas.

9. An apparatus for producing ceramic fine particles in the range of from 0.001 to 10 μm comprising a starting material vaporizer for vaporizing one or more metal compounds to give gaseous starting materials; a device for supplying a carrier gas for conveying said gaseous starting materials; a coaxial, double-cylinder reaction apparatus for forming a Taylor vortex flow, the reaction apparatus having a stationary outer cylinder and a rotatable inner cylinder, and further comprising a feed opening for supplying the gaseous starting materials; an inner cylinder rotating motor device for rotating said inner cylinder; an energy supplying device for supplying energy required for chemical reaction to a reaction space, the reaction space being arranged in an annular portion between the inner and outer cylinders of the reaction apparatus; and a device for collecting fine particles.

10. The production apparatus according to claim 9, wherein a feed opening for supplying core fine particles is further arranged in the coaxial, double-cylinder reaction apparatus, the feed opening being connected with a means for supplying the core fine particles.

11. A method for producing ceramic fine particles having a particle diameter in the range of from 0.05 to 5 μm comprising the steps of forming fine starting material droplets having an average droplet diameter of 0.1 μm to 100 μm using a solution containing one or more metal salts; supplying said starting material droplets with a carrier gas to a reaction space arranged in an annular portion between inner and outer cylinders of a coaxial, double-cylinder reaction apparatus, the reaction apparatus having a stationary outer cylinder and a rotatable inner cylinder; and subjecting said starting material droplets to pyrolytic reaction in said reaction space while rotating the inner cylinder.

12. The method according to claim 11, wherein the rotational angular velocity of the inner cylinder is controlled to form a Taylor vortex flow in a vapor phase containing said starting material droplets inside the reaction space.

13. The method according to claim 11, wherein the rotational angular velocity of the inner cylinder and the axial velocity of the vapor phase containing said starting material droplets are controlled to have a Taylor number and a Reynolds number expressed by the following equations, respectively, in the ranges of from 40 to 15,000 and from 0.05 to 2,000.

$$Ta = (Ri \cdot \omega d/v)(d/Ri)^{1/2}$$

$$Re = d \cdot u'/v'$$

wherein Ta stands for a Taylor number; Ri stands for a radius of an inner cylinder; $\omega$ stands for a rotational angular velocity of an inner cylinder; Re stands for a Reynolds number; d stands for a width of an annular portion between the inner and outer cylinders; v stands for kinematic viscosity of the vapor phase containing said starting material droplets; and u' is an axial velocity of the vapor phase containing said starting material droplets.

14. The method according to claim 11, wherein the temperature of the reaction space is from 50° to 2000° C.

15. The method according to claim 11, wherein the concentration of metal salts in the starting material droplets is from $10^{-5}$ to 20 mol/L.

16. The method according to claim 11, wherein the concentration of the starting material droplets supplied is from $10^2$ to $10^{11}$ particles/m$^3$, based on the carrier gas.

17. The method according to claim 11, wherein the average droplet diameter of the starting material droplets is from 0.1 to 100 μm.

18. An apparatus for producing ceramic fine particles in the range of from 0.05 to 5 μm comprising a device for supplying a solution containing one or more metal salts; a device for atomizing starting materials for forming fine droplets from said solution to give starting material droplets; a device for supplying a carrier gas for conveying said starting material droplets; a coaxial, double-cylinder reaction apparatus for forming Taylor vortex flow, the reaction apparatus having a stationary outer cylinder and a rotatable inner cylinder; an inner cylinder rotating motor device for rotating said inner cylinder; a thermal energy supplying device for supplying thermal energy required for pyrolyric reaction to the reaction space, the reaction space being arranged in an annular portion between the inner and outer cylinders of the reaction apparatus; and a device for collecting fine particles.

* * * * *